(12) United States Patent
Ishimitsu et al.

(10) Patent No.: US 10,606,209 B2
(45) Date of Patent: Mar. 31, 2020

(54) HOUSING AND IMAGE FORMING APPARATUS

(71) Applicants: Hiroki Ishimitsu, Kanagawa (JP); Shiro Akama, Tokyo (JP); Tsuyoshi Endo, Kanagawa (JP); Tatsuya Suzuki, Kanagawa (JP)

(72) Inventors: Hiroki Ishimitsu, Kanagawa (JP); Shiro Akama, Tokyo (JP); Tsuyoshi Endo, Kanagawa (JP); Tatsuya Suzuki, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 16/244,265

(22) Filed: Jan. 10, 2019

(65) Prior Publication Data

US 2019/0286047 A1    Sep. 19, 2019

(30) Foreign Application Priority Data

Mar. 16, 2018   (JP) .................................. 2018-049598

(51) Int. Cl.
*G03G 21/00*      (2006.01)
*H05K 5/00*       (2006.01)
*G03G 21/16*      (2006.01)
*H05K 5/02*       (2006.01)
*H05K 5/03*       (2006.01)

(52) U.S. Cl.
CPC ..... *G03G 21/1633* (2013.01); *G03G 21/1619* (2013.01); *G03G 21/1638* (2013.01); *G03G 21/1647* (2013.01); *H05K 5/0239* (2013.01); *H05K 5/03* (2013.01); *G03G 2221/169* (2013.01); *G03G 2221/1678* (2013.01)

(58) Field of Classification Search
CPC .......... G03G 21/1638; G03G 21/1633; G03G 21/1619; G03G 21/1647; G03G 2221/1672; G03G 2221/1678; G03G 2221/169; H05K 5/0013; H05K 5/0239; H05K 5/03
USPC ...................... 399/107, 124, 407; 312/223.2; 361/679.02; 174/560, 563
See application file for complete search history.

(56) References Cited

U.S. PATENT DOCUMENTS 7,428,835 B2 * 9/2008 Fan ..................... E05B 63/0017
                                                  312/223.2
9,268,131 B2 * 2/2016 Ozawa ............... G03G 21/1666
9,815,640 B2 * 11/2017 Obara ................ G03G 15/6502

FOREIGN PATENT DOCUMENTS

| JP | 60008857 A   | * | 1/1985  | ............ G03G 15/00 |
| JP | 2006284723 A | * | 10/2006 | |
| JP | 2009-169121  |   | 7/2009  | |
| JP | 2009-169126  |   | 7/2009  | |
| JP | 2012013857 A | * | 1/2012  | |

(Continued)

*Primary Examiner* — Robert B Beatty
(74) *Attorney, Agent, or Firm* — Harness, Dickey & Pierce, P.L.C.

(57) ABSTRACT

A housing includes a body portion, including an opening, and a cover portion that covers the opening. The cover portion includes a first cover and a second cover that is perpendicular to the first cover. The first cover includes a cover body that is platy. A projection projects from the cover body. A first attachment is mounted on the projection and attaches the first cover to the body portion. A second attachment is disposed on the first attachment and attaches the second cover to the first cover.

20 Claims, 12 Drawing Sheets

(56) References Cited

FOREIGN PATENT DOCUMENTS

JP       2014-149420       8/2014
JP       2016191793 A  *  11/2016

* cited by examiner

US 10,606,209 B2

HOUSING AND IMAGE FORMING APPARATUS

CROSS-REFERENCE TO RELATED APPLICATION

This patent application is based on and claims priority pursuant to 35 U.S.C. § 119(a) to Japanese Patent Application No. 2018-049598, filed on Mar. 16, 2018, in the Japan Patent Office, the entire disclosure of which is hereby incorporated by reference herein.

BACKGROUND

Technical Field

Exemplary aspects of the present disclosure relate to a housing and an image forming apparatus, and more particularly, to a housing having a plurality of covers and an image forming apparatus incorporating the housing.

Discussion of the Background Art

Related-art image forming apparatuses, such as copiers, facsimile machines, printers, and multifunction peripherals (MFP) having two or more of copying, printing, scanning, facsimile, plotter, and other functions, typically form an image on a recording medium according to image data by electrophotography.

A laser printer, as one example of such image forming apparatuses, includes a body having a rectangular box shape. The body accommodates various processing devices, such as a photoconductive drum, a charger, a developing device, a transfer device, and a fixing device, which are supported by a frame.

A front cover that is also used as a bypass sheet feeder (e.g., a bypass tray) and is openable and closable covers a front of the body. A left side cover and a right side cover cover a left side and a right side of the body, respectively. A rear cover covers a rear of the body. A top cover covers a top of the body. The front cover, the left side cover, the right side cover, and the rear cover serve as exterior covers. An attachment is molded with a lower rear end of the right side cover. The attachment is bent inward perpendicularly relative to a surface of the right side cover. The right side cover includes a rectangular opening through which an operator accesses an inside of the body. An auxiliary cover covers the opening.

The plurality of exterior covers that covers the body may include a first exterior cover, a second exterior cover, and a third exterior cover. An attachment position where the first exterior cover is attached to the second exterior cover may be different from an attachment position where the third exterior cover is attached to the first exterior cover. Accordingly, dimensional tolerances may accumulate, causing difficulty in placing the second exterior cover at a predetermined position. Consequently, the plurality of exterior covers may not be positioned precisely.

SUMMARY

This specification describes below an improved housing. In one embodiment, the housing includes a body portion, including an opening, and a cover portion that covers the opening. The cover portion includes a first cover and a second cover that is perpendicular to the first cover. The first cover includes a cover body that is platy. A projection projects from the cover body. A first attachment is mounted on the projection and attaches the first cover to the body portion. A second attachment is disposed on the first attachment and attaches the second cover to the first cover.

This specification further describes an improved image forming apparatus. In one embodiment, the image forming apparatus includes a finisher that performs finishing on a recording medium and a housing that covers the finisher. The housing includes a body portion, including an opening, and a cover portion that covers the opening. The cover portion includes a first cover and a second cover that is perpendicular to the first cover. The first cover includes a cover body that is platy. A projection projects from the cover body. A first attachment is mounted on the projection and attaches the first cover to the body portion. A second attachment is disposed on the first attachment and attaches the second cover to the first cover.

This specification further describes an improved image forming apparatus. In one embodiment, the image forming apparatus includes an image reader that reads an image on an original, an image forming portion that forms the image on a recording medium, and a housing that is interposed between the image reader and the image forming portion in a vertical direction. The housing includes a body portion, including an opening, and a cover portion that covers the opening. The cover portion includes a first cover and a second cover that is perpendicular to the first cover. The first cover includes a cover body that is platy. A projection projects from the cover body. A first attachment is mounted on the projection and attaches the first cover to the body portion. A second attachment is disposed on the first attachment and attaches the second cover to the first cover.

BRIEF DESCRIPTION OF THE DRAWINGS

A more complete appreciation of the embodiments and many of the attendant advantages and features thereof can be readily obtained and understood from the following detailed description with reference to the accompanying drawings, wherein.

Figure 1:
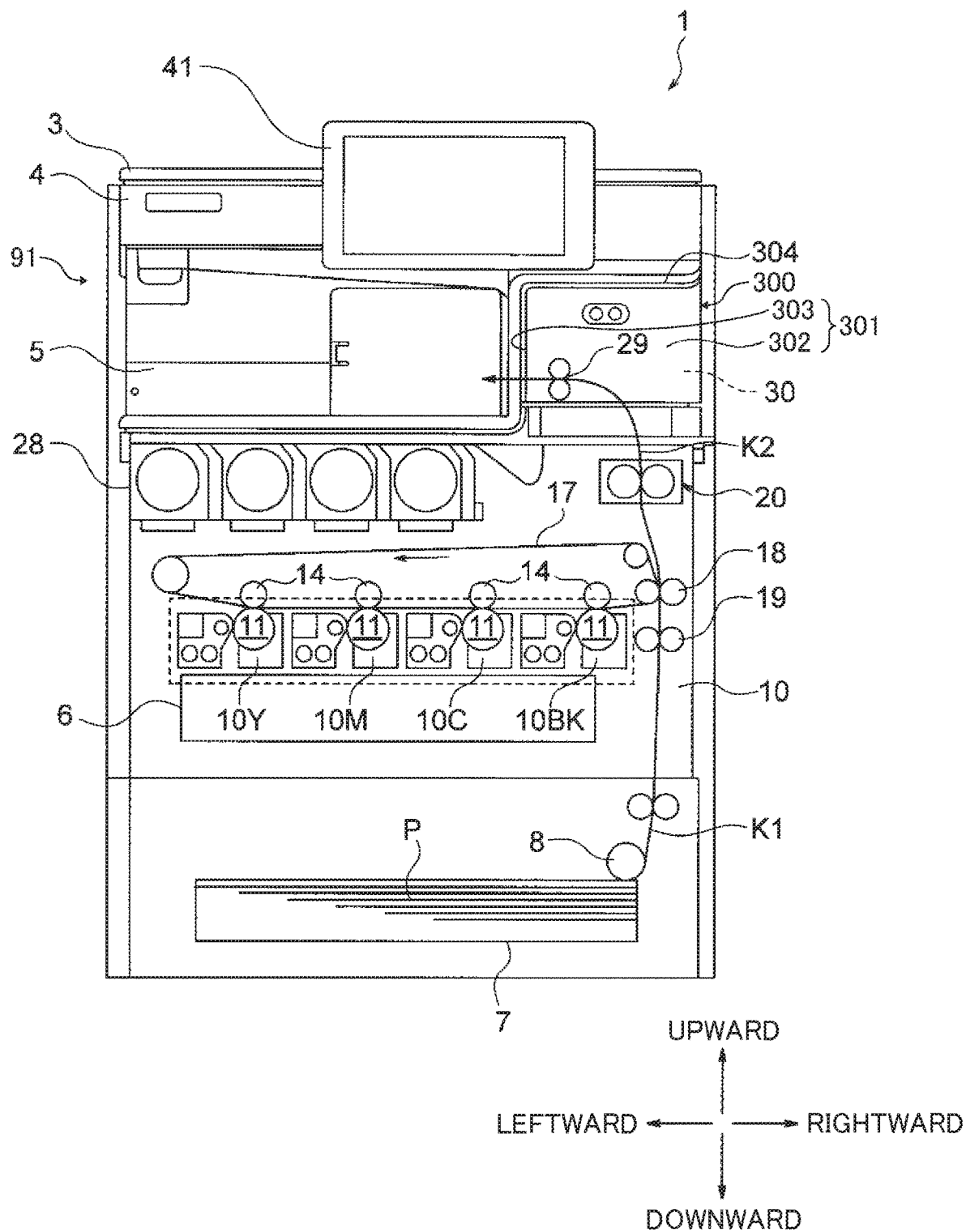
FIG. 1 is a schematic cross-sectional view of an image forming apparatus according to an embodiment of the present disclosure.

The accompanying drawings are intended to depict embodiments of the present disclosure and should not be interpreted to limit the scope thereof. The accompanying drawings are not to be considered as drawn to scale unless explicitly noted. Also, identical or similar reference numerals designate identical or similar components throughout the several views.

DETAILED DESCRIPTION

In describing embodiments illustrated in the drawings, specific terminology is employed for the sake of clarity. However, the disclosure of this specification is not intended to be limited to the specific terminology so selected and it is to be understood that each specific element includes all technical equivalents that have a similar function, operate in a similar manner, and achieve a similar result.

As used herein, the singular forms "a", "an", and "the" are intended to include the plural forms as well, unless the context clearly indicates otherwise.

Referring now to the drawings, wherein like reference numerals designate identical or corresponding parts throughout the several views, particularly to FIG. 1, an image forming apparatus 1 according to an embodiment is explained.

The image forming apparatus 1 may be a copier, a facsimile machine, a printer, a multifunction peripheral or a multifunction printer (MFP) having at least two of copying, printing, scanning, facsimile, and plotter functions, or the like.

In the drawings, identical reference numerals are assigned to identical elements and equivalents and redundant descriptions of the identical elements and the equivalents are summarized or omitted properly.

Referring to FIG. 1, a description is provided of a construction and an operation of an entirety of the image forming apparatus 1.

The image forming apparatus 1 according to this embodiment forms an image by electrophotography. The image forming apparatus 1 is a tandem color image forming apparatus in which a plurality of process cartridges 10Y, 10M, 10C, and 10BK is aligned and disposed opposite an intermediate transfer belt 17.

FIG. 1 illustrates a color copier as the image forming apparatus 1. An original conveyer 3 conveys an original to an image reader 4. The image reader 4 (e.g., a scanner) reads an image on the original into image data. A writer 6 (e.g., an exposure device) emits a laser beam according to the image data sent from the image reader 4. A sheet feeder 7 (e.g., a sheet feeding tray or a paper tray) stores sheets P (e.g., transfer sheets). The process cartridges 10Y, 10M, 10C, and 10BK serve as image forming devices that form yellow, magenta, cyan, and black toner images, respectively. The intermediate transfer belt 17 serves as a transferor transferred with the yellow, magenta, cyan, and black toner images such that the yellow, magenta, cyan, and black toner images are superimposed on the intermediate transfer belt 17 to form a full color toner image. A secondary transfer roller 18 transfers the full color toner image formed on the intermediate transfer belt 17 onto a sheet P serving as a recording medium. A fixing device 20 fixes the unfixed full color toner image on the sheet P. Toner bottles 28 supply yellow, magenta, cyan, and black toners to developing devices of the process cartridges 10Y, 10M, 10C, and 10BK, respectively. An optional device 30 is a finisher that performs finishing on the sheet P.

In the image forming apparatus 1 according to this embodiment, a sheet ejection device 5 onto which the sheet P is ejected is disposed in a space between an image forming portion 10 and the image reader 4. The image forming portion 10 is a main section that performs image formation and includes the image forming devices (e.g., the process cartridges 10Y, 10M, 10C, and 10BK). For example, the sheet P bearing the desired full color toner image on a surface of the sheet P is ejected into the space between the image forming portion 10 and the image reader 4 as an output image. The sheet ejection device 5, the image reader 4 (e.g., the scanner), and the image forming portion 10 construct an internal sheet ejection device 91 serving as an internal sheet ejection portion. The optional device 30 is removably installed at a position upstream from the sheet ejection device 5 in a sheet conveyance direction, that is, on the right of the sheet ejection device 5 in FIG. 1. The optional device 30 performs finishing, such as punching, aligning, and binding, on the sheets P ejected from the image forming portion 10. Photoconductive drums 11 (e.g., photoconductors) serving as image bearers, developing devices, and cleaners are combined into the process cartridges 10Y, 10M, 10C, and 10BK serving as the image forming devices, respectively. The yellow, magenta, cyan, and black toner images are formed on the photoconductive drums 11, serving as the image bearers, of the process cartridges 10Y, 10M, 10C, and 10BK, respectively.

A description is provided of image forming processes for forming a full color toner image, which are performed by the image forming apparatus 1.

A conveyance roller of the original conveyer 3 conveys an original placed on an original tray onto an exposure glass of the image reader 4. The image reader 4 optically reads an image on the original placed on the exposure glass. For example, the image reader 4 irradiates and scans the image on the original placed on the exposure glass with light emitted from a lamp. The light reflected by the original is reflected by a plurality of mirrors and is traveled through a lens to a color sensor that forms an image. The color sensor reads color image information of the image on the original per color separation light for red (R), green (G), and blue (B) and then converts the color image information into electric image signals. An image processor performs processing such as color conversion, color correction, and spatial frequency correction based on the electric image signals for RGB color separation, thus creating yellow, magenta, cyan, and black image data.

The yellow, magenta, cyan, and black image data is sent to the writer 6. The writer 6 irradiates the photoconductive drums 11 of the process cartridges 10Y, 10M, 10C, and 10BK with laser beams (e.g., exposure light) according to the yellow, magenta, cyan, and black image data, respectively.

In each of the four process cartridges 10Y, 10M, 10C, and 10BK, the photoconductive drum 11 rotates clockwise in FIG. 1. A charger (e.g., a charging roller) uniformly charges a surface of the photoconductive drum 11 at a charging position where the charger is disposed opposite the photoconductive drum 11. Thus, a charging potential is produced on the photoconductive drum 11. Thereafter, the charged surface of the photoconductive drum 11 reaches an irradiation position where the laser beam irradiates the photoconductive drum 11. A light source of the writer 6 emits the laser beam according to the electric image signal for corresponding color. After the laser beam enters a polygon mirror and is reflected by the polygon mirror, the laser beam is transmitted through a plurality of lenses. After transmission through the plurality of lenses, the laser beam passes through an optical path separately provided for each color component of yellow, magenta, cyan, and black.

The laser beam corresponding to the color component of yellow irradiates the surface of the leftmost photoconductive drum 11 of the process cartridge 10Y in FIG. 1. The polygon mirror rotating at high speed causes the laser beam corresponding to the color component of yellow to scan the photoconductive drum 11 in an axial direction thereof, that is, a main scanning direction. Thus, an electrostatic latent image corresponding to the color component of yellow is formed on the photoconductive drum 11 that is charged by the charging roller.

Similarly, the laser beam corresponding to the color component of magenta irradiates the surface of the photoconductive drum 11 of the process cartridge 10M, that is, the second photoconductive drum 11 from the left in FIG. 1, thus forming an electrostatic latent image corresponding to the color component of magenta. The laser beam corresponding to the color component of cyan irradiates the surface of the photoconductive drum 11 of the process cartridge 10C, that is, the third photoconductive drum 11 from the left in FIG. 1, thus forming an electrostatic latent image corresponding to the color component of cyan. The laser beam corresponding to the color component of black irradiates the surface of the photoconductive drum 11 of the process cartridge 10BK (e.g., the image forming device that forms a black toner image), that is, the fourth photoconductive drum 11 from the left in FIG. 1 or the most downstream photoconductive drum 11 in a rotation direction of the intermediate transfer belt 17, thus forming an electrostatic latent image corresponding to the color component of black.

Thereafter, the surface of the photoconductive drum 11 bearing the electrostatic latent image corresponding to each color component reaches a developing position where the developing device is disposed opposite the photoconductive drum 11. The developing device supplies toner corresponding to each color component onto the photoconductive drum 11, developing the electrostatic latent image formed on the photoconductive drum 11 into a toner image. Thereafter, the surface of the photoconductive drum 11 after developing reaches a primary transfer position where the intermediate transfer belt 17 is disposed opposite the photoconductive drum 11. A primary transfer roller 14 is disposed at each primary transfer position such that the primary transfer roller 14 contacts an inner circumferential surface of the intermediate transfer belt 17. The primary transfer rollers 14, at the primary transfer positions, primarily transfer yellow, magenta, cyan, and black toner images formed on the photoconductive drums 11 onto the intermediate transfer belt 17 serving as an image bearer successively such that the yellow, magenta, cyan, and black toner images are superimposed on a same position on the intermediate transfer belt 17 to form a full color toner image.

After primary transfer, the surface of each of the photoconductive drums 11 reaches a cleaning position where the cleaner is disposed opposite the photoconductive drum 11. The cleaner collects toner failed to be transferred onto the intermediate transfer belt 17 and therefore remained on the photoconductive drum 11 therefrom. Thereafter, the surface of the photoconductive drum 11 passes through a discharging position where a discharger is disposed opposite the photoconductive drum 11, thus finishing a series of processes for image formation performed on the photoconductive drum 11.

A surface of the intermediate transfer belt 17, which is transferred and superimposed with the yellow, magenta, cyan, and black toner images formed on the photoconductive drums 11 to form the full color toner image, moves in the rotation direction indicated by an arrow in FIG. 1 and reaches a secondary transfer position where the secondary transfer roller 18 is disposed opposite the intermediate transfer belt 17. The secondary transfer roller 18, at the secondary transfer position, secondarily transfers the full color toner image formed on the intermediate transfer belt 17 onto a sheet P. Thereafter, the surface of the intermediate transfer belt 17 reaches a cleaning position where an intermediate transfer belt cleaner is disposed opposite the intermediate transfer belt 17. The intermediate transfer belt cleaner collects toner failed to be transferred onto the sheet P and therefore remained on the intermediate transfer belt 17 therefrom, thus finishing a series of transfer processes performed on the intermediate transfer belt 17.

The sheet P is conveyed from the sheet feeder 7 through a conveyance path K1 provided with a registration roller pair 19 and the like to the secondary transfer roller 18. For example, a sheet feeding roller 8 feeds the sheet P from the sheet feeder 7 that stores the sheet P to the registration roller pair 19 (e.g., a timing roller pair) through the conveyance path K1. The registration roller pair 19 conveys the sheet P reaching thereto to the secondary transfer roller 18 at a time when the full color toner image formed on the intermediate transfer belt 17 reaches the secondary transfer position.

Thereafter, the sheet P transferred with the full color toner image is conveyed to the fixing device 20. The fixing device 20 fixes the full color toner image on the sheet P at a nip formed between a fixing roller and a pressure roller. The sheet P after fixing passes through a conveyance path K2 provided with a sheet ejection roller pair 29 and the like. The sheet P is ejected into the sheet ejection device 5 outside the image forming portion 10 as an output image, thus finishing a series of image forming processes. Before the sheet P is ejected into the sheet ejection device 5, the optional device 30 performs finishing on the sheet P. For example, an internal finisher performs punching, aligning, binding (e.g., stapling), and the like. A relay unit performs Z-folding, folding in two, inner folding in three, outer folding in three, and the like.

If a duplex print mode to print on both sides, that is, a front side and a back side, of the sheet P is selected, the sheet P bearing the fixed toner image on the front side of the sheet P is guided to a duplex conveyance path without being ejected onto the sheet ejection device 5. After the sheet P is reversed in the duplex conveyance path, the sheet P is conveyed to the secondary transfer roller 18 again. The secondary transfer roller 18 secondarily transfers another toner image onto the back side of the sheet P similarly as described above. Thereafter, the fixing device 20 fixes the toner image on the back side of the sheet P. The sheet P passes through the conveyance path K2 and is ejected into the sheet ejection device 5 outside the image forming portion 10 as an output image. In the duplex print mode also, the optional device 30 performs finishing such as punching, aligning, and binding (e.g., stapling) on the sheet P to be ejected into the sheet ejection device 5.

Figure 2:
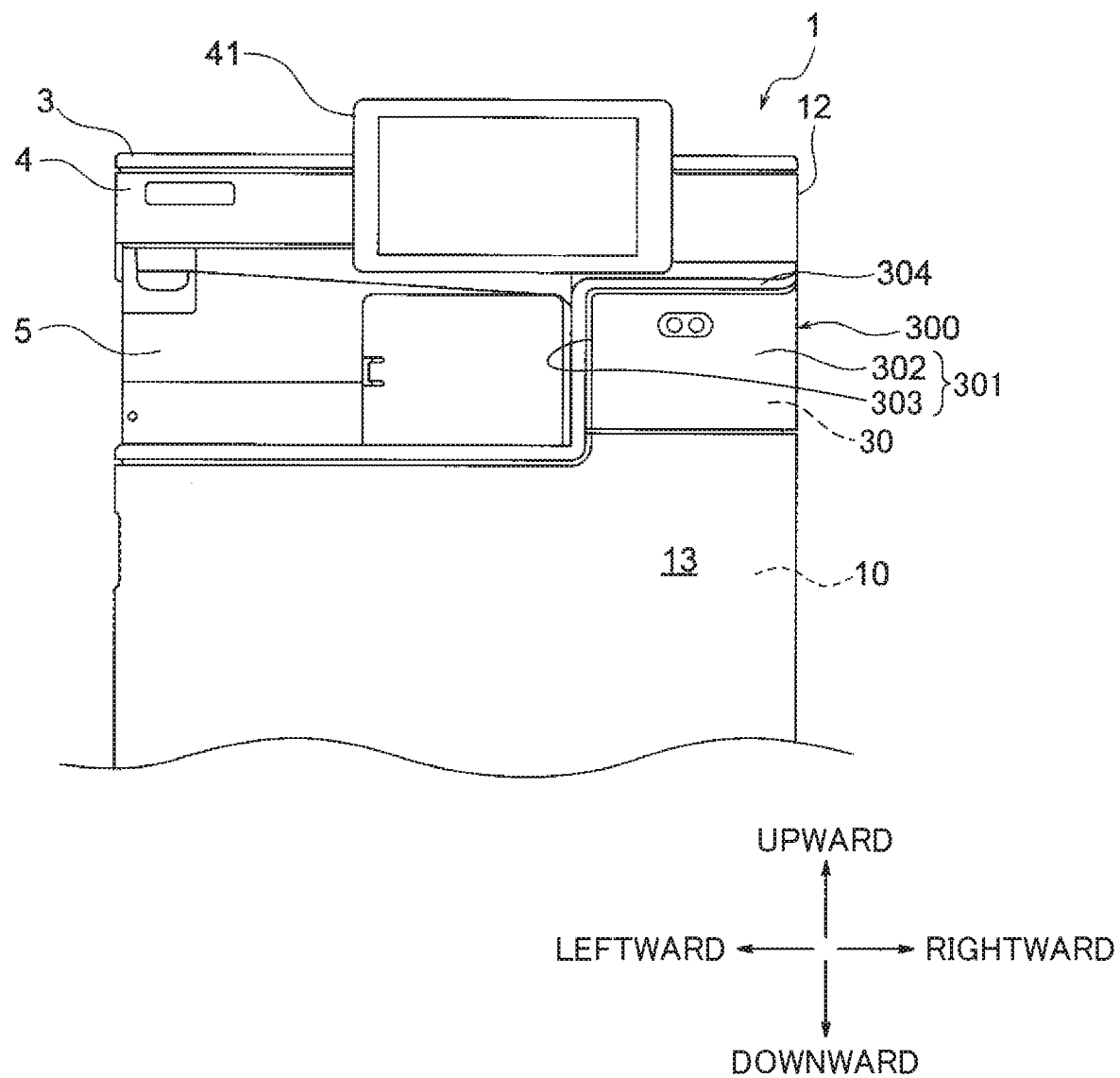
FIG. 2 is a partial front view of the image forming apparatus depicted in FIG. 1.

FIG. 2 is a partial front view of the image forming apparatus 1. As illustrated in FIG. 2, the image forming apparatus 1 further includes a support 12 that supports the image forming portion 10 and the like, a front cover 13 that covers a front of the image forming portion 10 mainly, and a front upper right cover portion 300. A control panel 41 is attached to a front face of the image reader 4 (e.g., the scanner). An operator such as a user and a service engineer opens and closes the front cover 13 to replace the process cartridges 10Y, 10M, 10C, and 10BK with new ones. Hereinafter, a front side of the image forming apparatus 1 in a direction perpendicular to a page illustrated with FIG. 1 may define a front. A rear side of the image forming apparatus 1 in the direction perpendicular to the page illustrated with FIG. 1 may define a rear. A direction in which the front upper right cover portion 300 is disposed with respect to the sheet ejection device 5 may define rightward or a rightward direction. A direction that is opposite the rightward direction may define leftward or a leftward direction. A direction in which the original conveyer 3 and the image reader 4 are disposed with respect to the sheet ejection device 5 may define upward or an upward direction. A direction that is opposite the upward direction may define downward or a downward direction.

The front upper right cover portion 300 includes an L-shaped cover 301, serving as a cover portion, and a third cover 304. The L-shaped cover 301 includes a first cover 302 and a second cover 303. When the operator installs the optional device 30, the L-shaped cover 301 or the second cover 303 serving as a part of the L-shaped cover 301 may be removed. To address this circumstance, a mechanism that facilitates attachment and detachment of the L-shaped cover 301 and the second cover 303 is requested.

Figure 3:
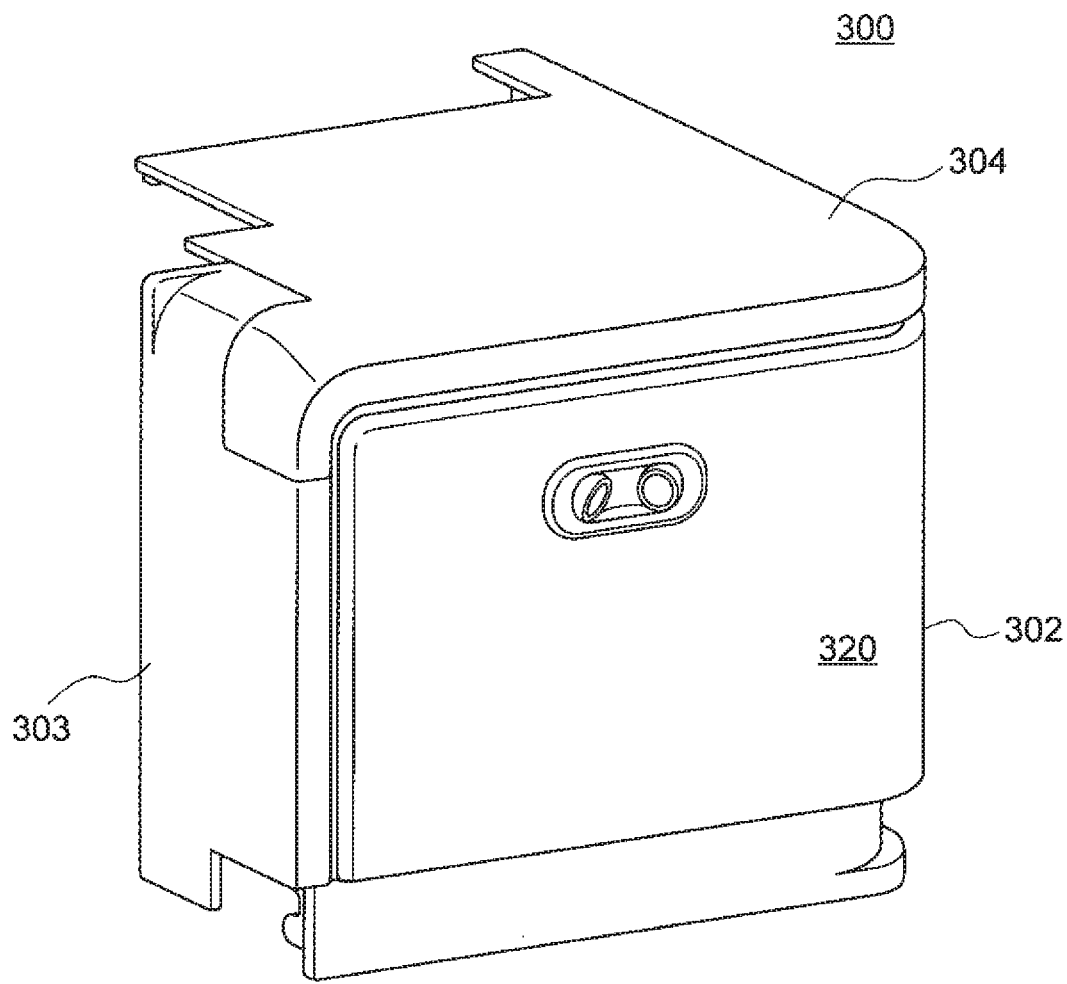
FIG. 3 is a front perspective view of a front upper right cover portion incorporated in the image forming apparatus depicted in FIG. 2.

FIG. 3 is a front perspective view of the front upper right cover portion 300. As illustrated in FIGS. 2 and 3, the front upper right cover portion 300 covers three faces, that is, a front face, a left side face, and a top face, of the optional device 30 that is interposed between the image forming portion 10 and the image reader 4 and is disposed on the right of the sheet ejection device 5.

Figure 4A:
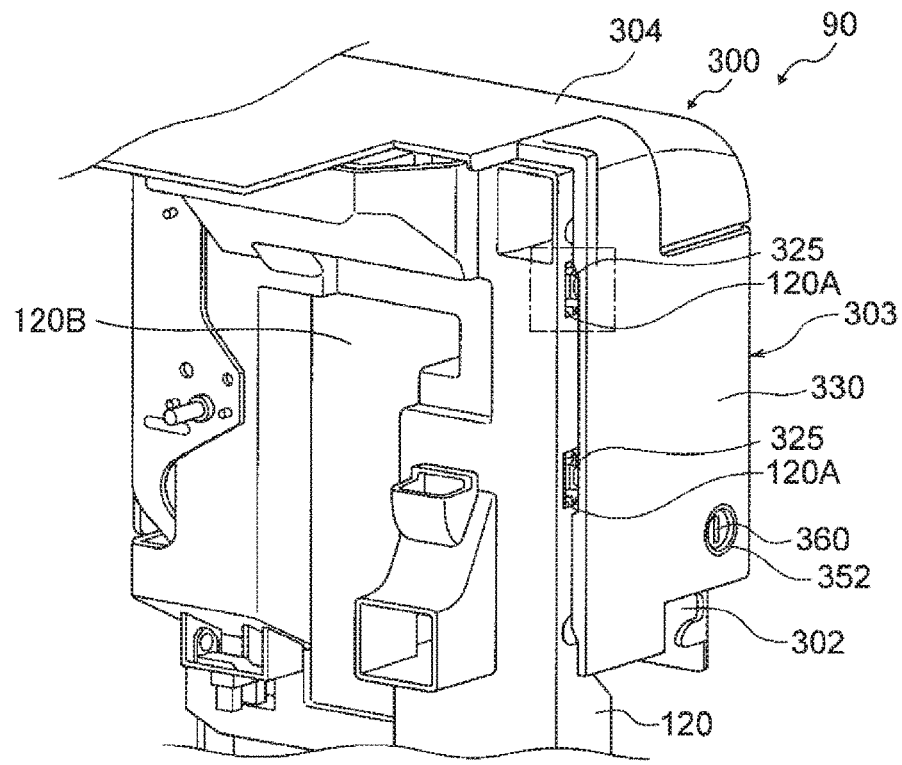
FIG. 4A is a perspective view of a first cover, a second cover, and a third cover of the front upper right cover portion depicted in FIG. 3, illustrating a first engagement of the first cover that engages a hole of a frame.
Figure 4B:
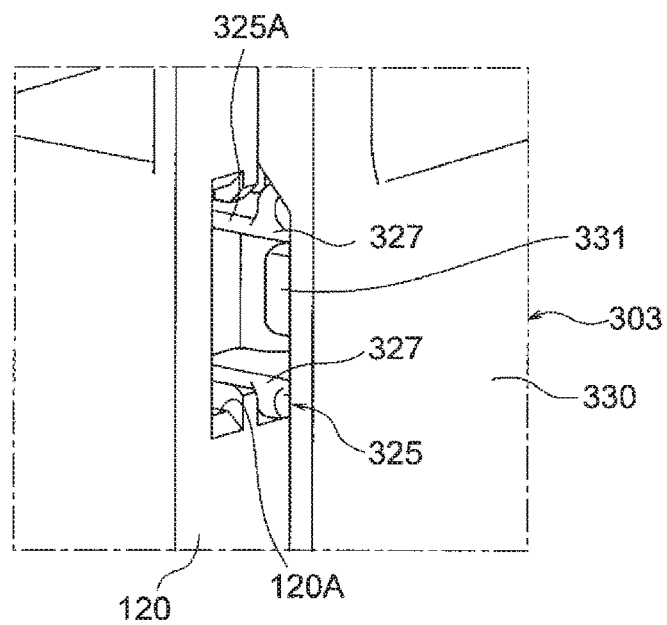
FIG. 4B is a partially enlarged perspective view of the second cover depicted in FIG. 4A.

FIG. 4A is a perspective view of the second cover 303 and the third cover 304. FIG. 4B is a partially enlarged perspective view of the second cover 303. As illustrated in FIGS. 4A and 4B, the front upper right cover portion 300 is detachably attached to a frame 120, serving as a body portion, which is a part of the support 12 and includes an opening 120B at a front of the frame 120. The frame 120 supports the optional device 30. The frame 120 and the front upper right cover portion 300 construct a housing 90.

As illustrated in FIG. 3, the front upper right cover portion 300 includes the L-shaped cover 301, including the first cover 302 and the second cover 303, and the third cover 304. As illustrated in FIG. 2, the L-shaped cover 301 includes the first cover 302, that covers the opening 120B at the front of the frame 120, and the second cover 303. As illustrated in FIG. 3, the second cover 303 is perpendicular to the first cover 302 and is attached to a left end of the first cover 302.

The third cover 304 is perpendicular to the first cover 302 and is attached to a top end of the first cover 302.

Figure 5A:
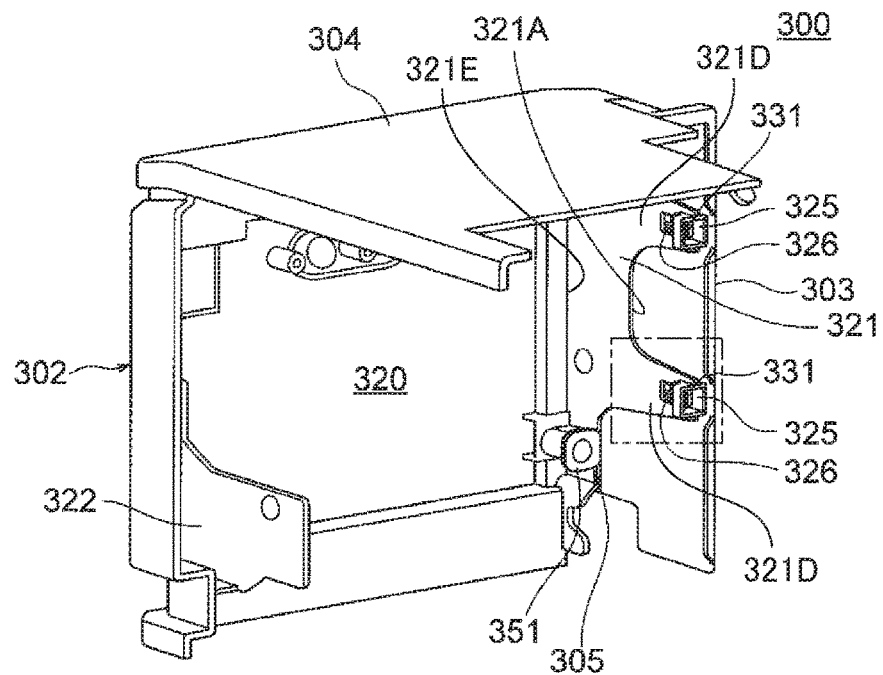
FIG. 5A is a perspective view of a back side of the front upper right cover portion depicted in FIG. 3.
Figure 5B:
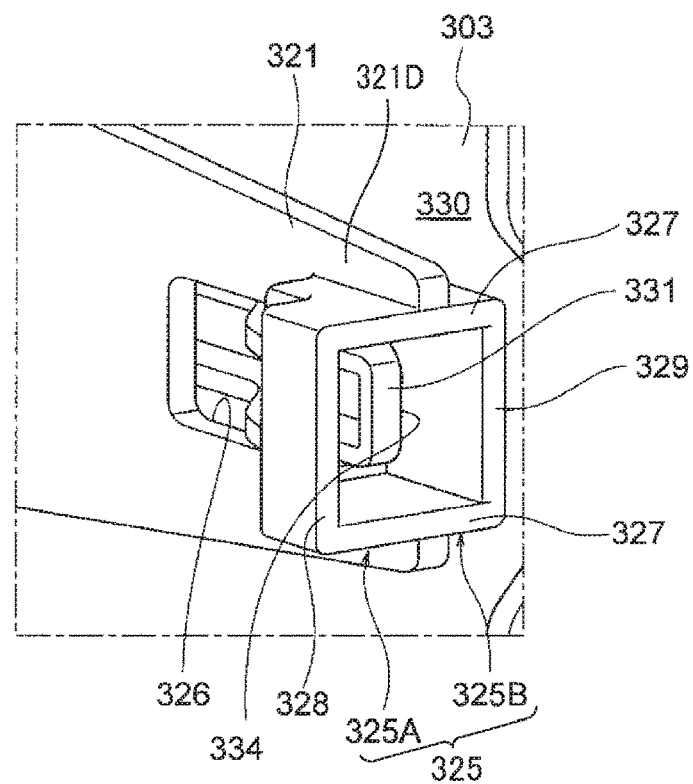
FIG. 5B is a partially enlarged perspective view of the back side of the front upper right cover portion depicted in FIG. 5A.
Figure 6:
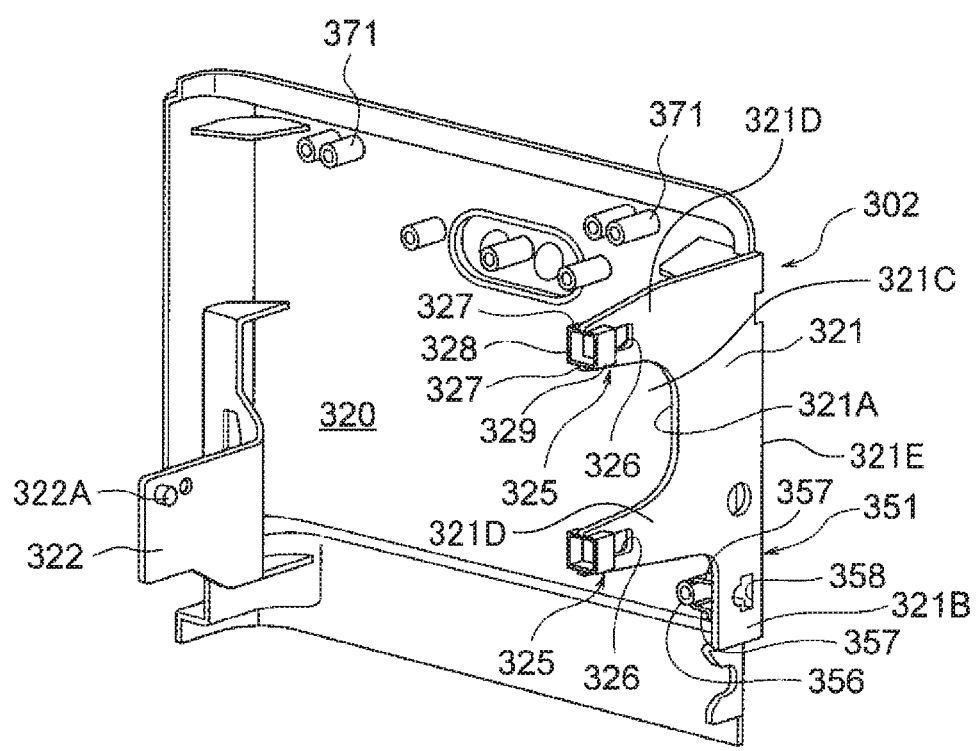
FIG. 6 is a perspective view of a back side of the first cover of the front upper right cover portion depicted in FIG. 5A.

FIG. 5A is a perspective view of a back side of the front upper right cover portion 300. FIG. 5B is a partially enlarged perspective view of the back side of the front upper right cover portion 300. FIG. 6 is a perspective view of a back side of the first cover 302 of the front upper right cover portion 300. As illustrated in FIGS. 5A, 5B, and 6, the first cover 302 includes a first cover body 320, a pair of a left arm 321 and a right arm 322 serving as a pair of resilient members or a pair of projections, a pair of first engagements 325 serving as a pair of first attachments, and a pair of engaging holes 326 serving as a pair of second attachments. The first cover body 320 is a plate that covers the opening 120B of the frame 120 depicted in FIG. 4A, which is situated at the front of the frame 120.

The left arm 321 and the right arm 322 serve as projections that project rearward from both ends, that is, a left end and a right end, of the first cover body 320 in a horizontal direction, respectively, such that the left arm 321 and the right arm 322 sandwich the frame 120. Each of the left arm 321 and the right arm 322 is a plate. The left arm 321 is disposed opposite the right arm 322 in the horizontal direction. The left arm 321 is disposed on an edge of an upper side end of the first cover body 320. The right arm 322 is disposed on an edge of a lower side end of the first cover body 320. The left arm 321 is shifted from the right arm 322 vertically.

Figure 7A:
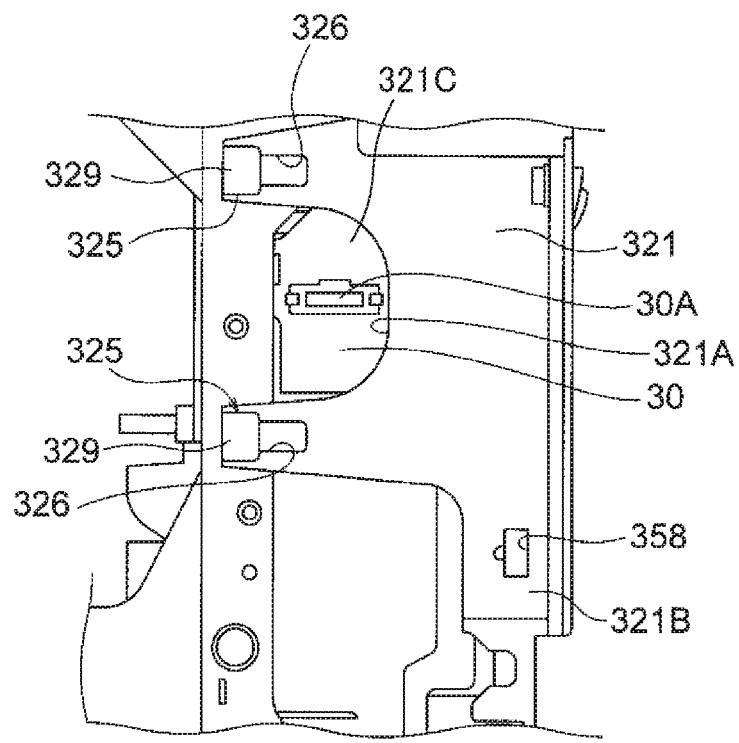
FIG. 7A is a side view of a left arm of the first cover depicted in FIG. 6 in a state in which the second cover is removed from the first cover.
Figure 7B:
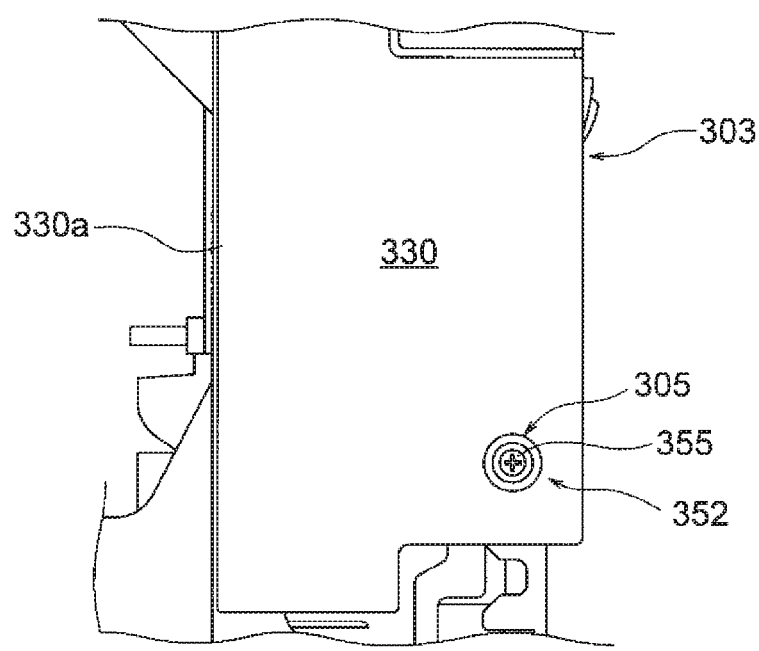
FIG. 7B is a side view of the second cover depicted in FIG. 4B in a state in which the first cover is attached to the second cover.

As illustrated in FIG. 6, a length of the left arm 321 is greater than a half of a length of the first cover body 320 and is greater than a length of the right arm 322 vertically. A middle portion 321A of the left arm 321 in a vertical direction defines a recess 321C (e.g., a cutout). For example, both ends of the left arm 321 in the vertical direction project rearward farther than the middle portion 321A disposed at a center of the left arm 321 in the vertical direction. FIG. 7A is a side view of the left arm 321 in a state in which the second cover 303 is removed from the first cover 302. FIG. 7B is a side view of the second cover 303 in a state in which the first cover 302 is attached to the second cover 303. As illustrated in FIG. 7A, the recess 321C defined by the middle portion 321A of the left arm 321 exposes a connector socket 30A of the optional device 30 supported by the frame 120. Accordingly, the operator plugs a connector into the connector socket 30A by removing the second cover 303 without removing the first cover 302.

As illustrated in FIG. 5A, the first engagements 325 are disposed at both ends of the left arm 321 in the vertical direction and disposed on free ends 321D (e.g., summits), that is, projections of the left arm 321, respectively. As the first engagements 325 engage holes 120A of the frame 120 depicted in FIG. 4A, respectively, the first cover body 320 is attached to the frame 120.

Figure 8:
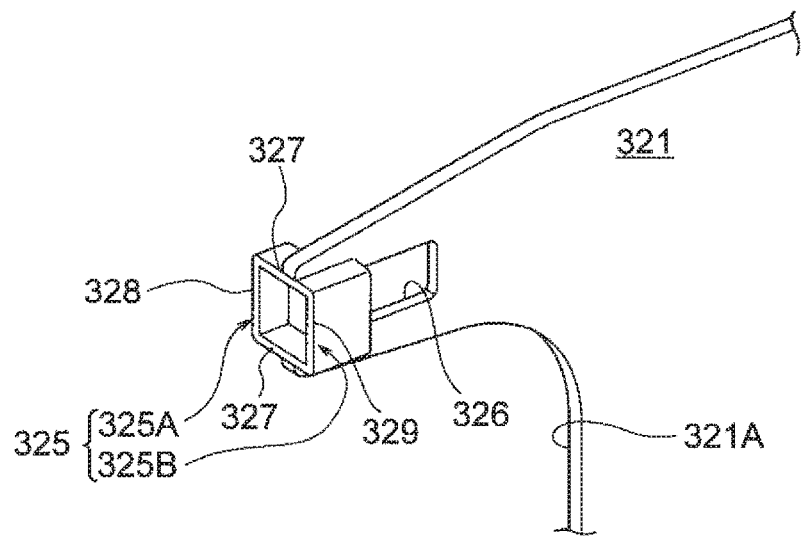
FIG. 8 is a partially enlarged perspective view of the first cover depicted in FIG. 6.

FIG. 8 is a partially enlarged perspective view of the first cover 302 depicted in FIG. 6. As illustrated in FIGS. 5B and 8, each of the first engagements 325 includes upper and lower plates 327 and a right side plate 328 and a left side plate 329 that bridge the upper and lower plates 327. Each of the first engagements 325 is a rectangular tube. The upper and lower plates 327 are disposed opposite each other vertically and project from a left face and a right face of the left arm 321. Hereinafter, each of the first engagements 325 may be defined as below. That is, each of the first engagements 325 includes a rightward projection 325A that projects rightward from the left arm 321 and a leftward projection 325B that projects leftward from the left arm 321. For example, the rightward projection 325A includes a rightward projecting portion of each of the upper and lower plates 327, which projects rightward from the left arm 321, and the right side plate 328. The leftward projection 325B includes a leftward projecting portion of each of the upper and lower plates 327, which projects leftward from the left arm 321, and the left side plate 329. In each of the first engagements 325, the rightward projection 325A engages the hole 120A of the frame 120. The leftward projection 325B contacts a second cover body 330 depicted in FIG. 4B when a second engagement 331 of the second cover 303 engages the engaging hole 326 of the first cover 302 depicted in FIG. 6.

As illustrated in FIG. 5B, the engaging hole 326 is a through hole disposed at the free end 321D of the left arm 321. The engaging hole 326 is a rectangle defined by a longitudinal direction of the engaging hole 326 as a front-rear direction and a width direction of the engaging hole 326 as the vertical direction. For example, the engaging hole 326 is situated at a substantially identical position with respect to the first engagement 325 in the front-rear direction and the vertical direction. As the second engagement 331 described below of the second cover 303 engages the engaging hole 326, the second cover body 330 is attached to the first cover body 320.

As illustrated in FIG. 6, the right arm 322 mounts a boss 322A that is tubular. The boss 322A is mounted on an interior face of the right arm 322, which faces the left arm 321. As each of the first engagements 325 engages the hole 120A of the frame 120, the boss 322A engages a recess disposed on an exterior face of the frame 120.

As illustrated in FIGS. 4A and 4B, the first cover 302 is moved closer to the frame 120 such that the first cover body 320 covers the opening 120B of the frame 120. As the pair of first engagements 325 contacts the frame 120 and the first cover body 320 is moved closer to the frame 120, the left arm 321 and the right arm 322 are stretched out. As the first cover body 320 is moved even closer to the frame 120, the left arm 321 and the right arm 322 resume a natural state thereof, sandwiching the frame 120. In each of the first engagements 325, the rightward projection 325A depicted in FIG. 8 engages the hole 120A of the frame 120. That is, each of the first engagements 325 engages the hole 120A of the frame 120. The boss 322A mounted on the right arm 322 depicted in FIG. 6 engages the recess of the frame 120. Thus, the first cover 302 engages the frame 120. Hence, the first cover 302 is attached to the frame 120.

Figure 9:
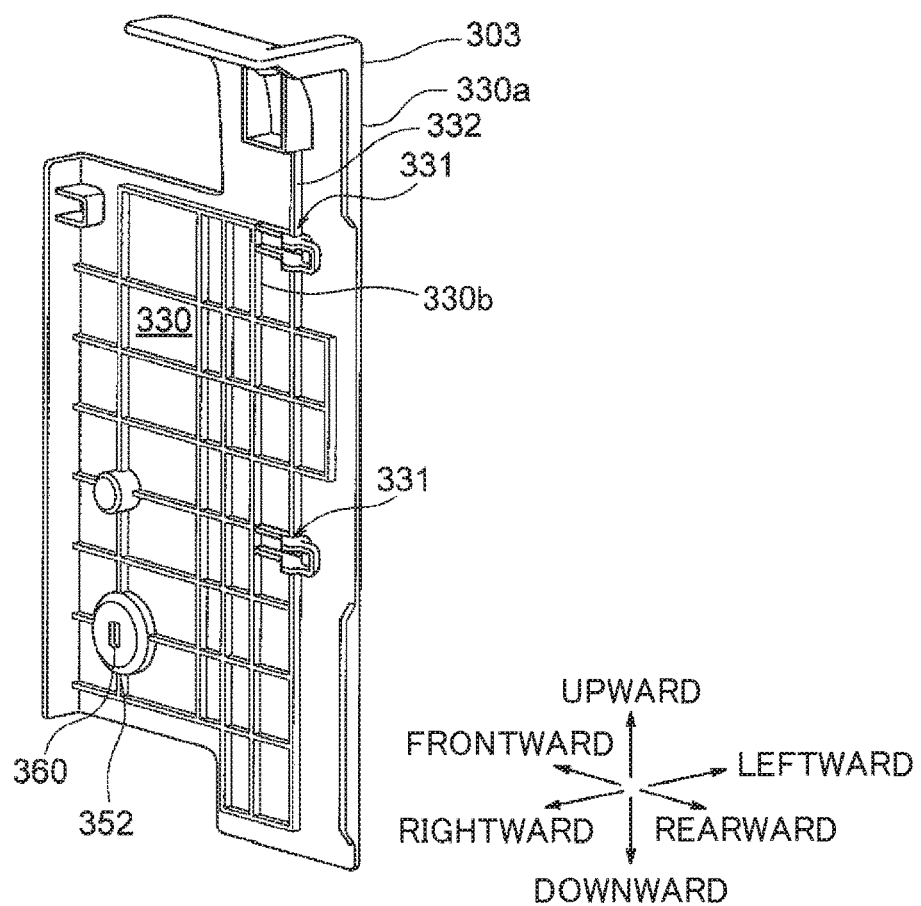
FIG. 9 is a perspective view of the second cover depicted in FIG. 7B, illustrating a back face thereof.

FIG. 9 is a perspective view of the second cover 303, illustrating a back face thereof. As illustrated in FIG. 9, the second cover 303 includes the second cover body 330 that is platy and the pair of second engagements 331. The second cover body 330 is interposed between the first cover 302 and the frame 120. Each of the second engagements 331 engages the engaging hole 326 depicted in FIG. 8 of the first cover 302. A back face of the second cover body 330 mounts a protrusion 332 (e.g., a rib), that is, a lattice, to enhance the strength of the second cover body 330.

As illustrated in FIG. 9, the pair of second engagements 331 is disposed slightly frontward from a rear end 330a of the second cover body 330. For example, when the second engagements 331 engage the engaging holes 326, respectively, each of the first engagements 325 is situated frontward from an intermediate portion 330b of the second cover body 330 in the front-rear direction.

Figure 10:
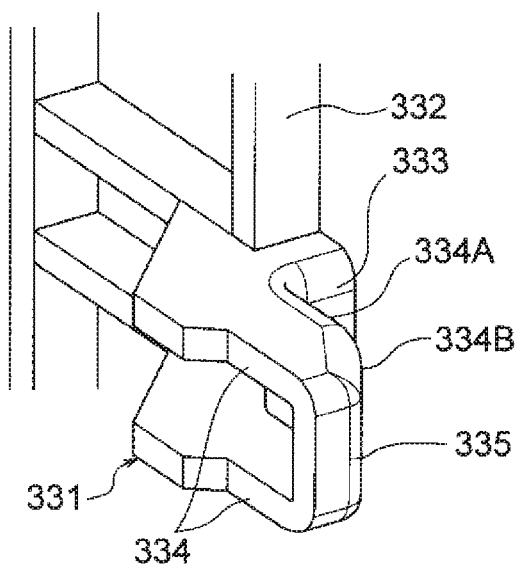
FIG. 10 is a partially enlarged perspective view of the second cover depicted in FIG. 9.

FIG. 10 is a partially enlarged perspective view of the second cover 303 depicted in FIG. 9. As illustrated in FIG. 9, each of the second engagements 331 is mounted on the back face of the second cover body 330. As illustrated in FIG. 10, each of the second engagements 331 includes a base 333, a pair of arms 334, and a bridge 335. The base 333 is contiguous to a rear face of the protrusion 332. The arms 334 project from an upper end and a lower end of the base 333, respectively. The bridge 335 is contiguously interposed between the arms 334. Each of the arms 334 projects in the rightward direction in which each of the arms 334 separates from the second cover body 330, and extends in the front-rear direction. A part of each of the arms 334 projects rearward from the base 333. The bridge 335 is disposed on a rear end of each of the arms 334.

Each of the arms 334 includes a plane 334A and a slope 334B. The plane 334A is spaced apart from the second cover body 330 for a predetermined distance. The slope 334B is disposed on a bridge side tip of the plane 334A, which is disposed in proximity to the bridge 335. The slope 334B is tilted relative to the second cover body 330 such that the distance between the slope 334B and the second cover body 330 increases gradually toward the bridge side tip of the plane 334A.

As illustrated in FIGS. 5A and 5B, the second cover body 330 of the second cover 303 is moved closer to the first cover 302 such that the second cover body 330 is disposed opposite a left side of the left arm 321 of the first cover 302. The bridge 335 of each of the second engagements 331 depicted in FIG. 10 is disposed opposite the free end 321D of the left arm 321. The base 333 of each of the second engagements 331 depicted in FIG. 10 is disposed opposite a base end, that is, a base 321E, of the left arm 321. With the bridge 335 and the base 333 that are directed as described above, each of the second engagements 331 is inserted into the engaging hole 326. As the slope 334B of each of the arms 334 depicted in FIG. 10 contacts a free end side end of the engaging hole 326, the slope 334B presses the leftward projection 325B against the second cover body 330 as illustrated in FIG. 5B. Thus, the second cover 303 engages the first cover 302. Hence, the second cover 303 is attached to the first cover 302.

As illustrated in FIG. 7B, the L-shaped cover 301 includes a first fastener 305 that fastens the first cover 302 and the second cover 303. As illustrated in FIGS. 7A, 11A, 11B, and 12, the first fastener 305 includes a first fastening portion 351, a second fastening portion 352, an L-shaped flat nut 353, and two metal screws 354 and 355. The first fastening portion 351 is mounted on the first cover 302. The second fastening portion 352 is mounted on the second cover 303.

Figure 11A:
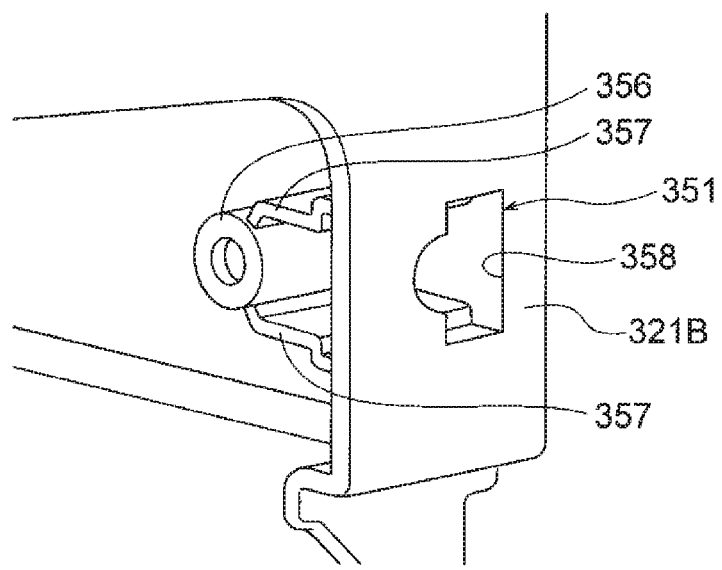
FIG. 11A is a perspective view of the first engagement of the first cover depicted in FIG. 4A.
Figure 11B:
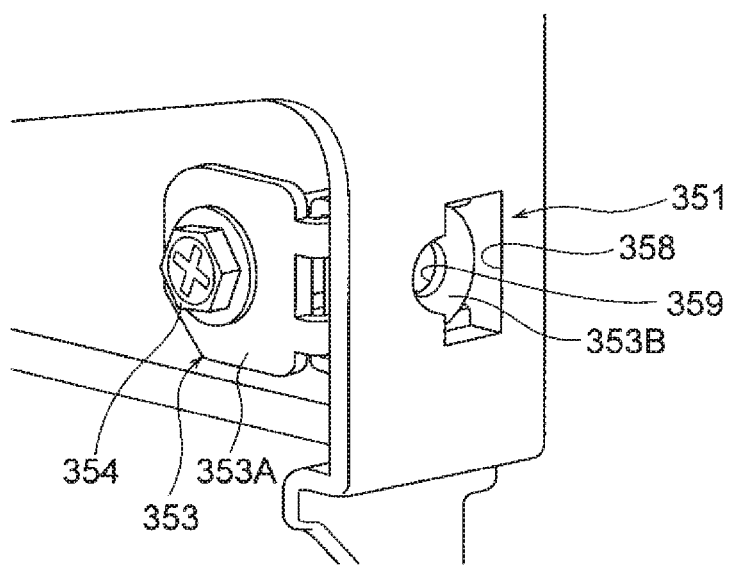
FIG. 11B is a perspective view of an L-shaped flat nut attached to the first engagement depicted in FIG. 11A.

As illustrated in FIG. 6, the first fastening portion 351 is disposed in a base portion 321B of the base 321E of the left arm 321. The base portion 321B is situated at a lower part of the base 321E and is contiguous to other part of the base 321E. As illustrated in FIG. 11A, the first fastening portion 351 includes a tube 356, a pair of supports 357, and an insertion through hole 358. The pair of supports 357 supports the tube 356. The insertion through hole 358 is disposed in the base portion 321B of the left arm 321. The metal screw 354 depicted in FIG. 11B is inserted into the insertion through hole 358. The tube 356 projects tubularly from the first cover body 320 depicted in FIG. 6. The pair of supports 357 is contiguously interposed between the base portion 321B and the tube 356.

Figure 12:
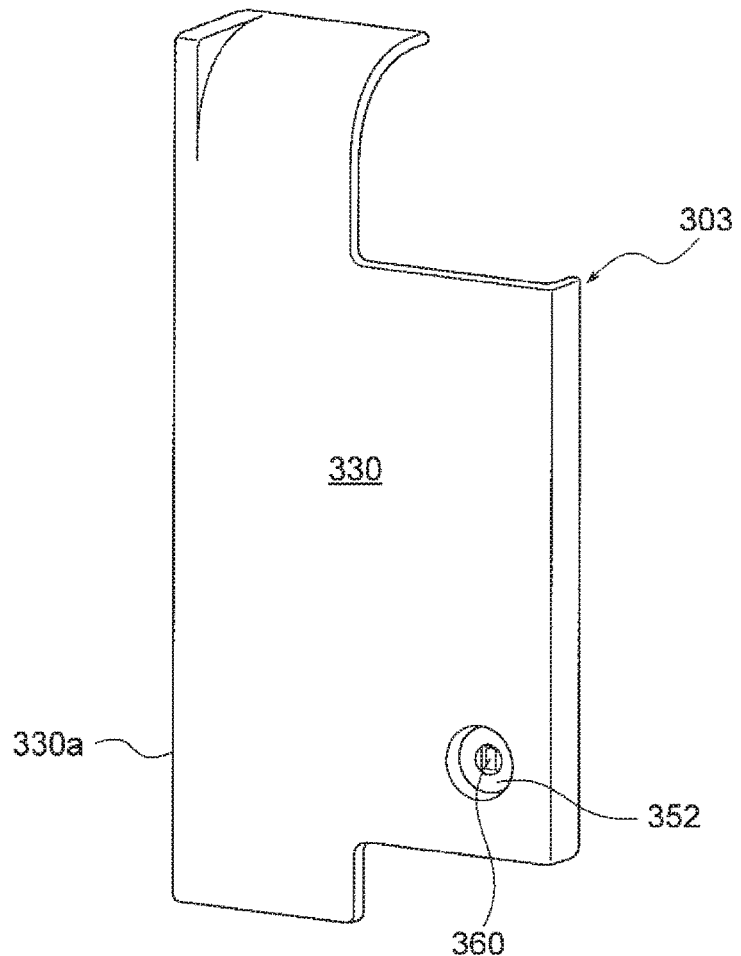
FIG. 12 is a perspective view of a front side of the second cover depicted in FIG. 9.

As illustrated in FIG. 12, the second fastening portion 352 includes a screw hole 360 into which the metal screw 355 depicted in FIG. 7B is screwed. The screw hole 360 is situated at a position where the screw hole 360 communicates with the insertion through hole 358 of the first fastening portion 351 depicted in FIG. 11A and a screw hole 359 of a second plate 353B of the L-shaped flat nut 353 depicted in FIG. 11B and described below horizontally in a left-to-right direction.

As illustrated in FIG. 11B, the L-shaped flat nut 353 includes a first plate 353A made of sheet metal and the second plate 353B made of sheet metal, which define an L-shape. The first plate 353A is mounted on a tip of the tube 356 of the first fastening portion 351 depicted in FIG. 11A. As the metal screw 354 is screwed into the tube 356, the first plate 353A is secured to the tube 356. The screw hole 359 of the second plate 353B is situated at a position where the screw hole 359 communicates with the insertion through hole 358 of the first fastening portion 351.

The first plate 353A of the L-shaped flat nut 353 of the first fastener 305 is moved closer to the tip of the tube 356 of the first cover 302. The metal screw 354 is screwed into the first plate 353A and the tube 356. The second fastening portion 352 of the second cover 303 depicted in FIG. 12 is moved closer to the first fastening portion 351. The metal screw 355 depicted in FIG. 7B is screwed into the screw hole 360 of the second fastening portion 352 depicted in FIG. 12, the insertion through hole 358 of the first fastening portion 351 depicted in FIG. 11B, and the screw hole 359 of the second plate 353B of the L-shaped flat nut 353 at a position where the screw hole 360, the insertion through hole 358, and the screw hole 359 communicate with the metal screw 355. Thus, the first cover 302 is secured to the second cover 303. The metal screw 355 of the first fastener 305 that secures the first cover 302 to the second cover 303 is removed by a client in a commercial market when the optional device 30 is installed. To address this circumstance, a screw made of metal (e.g., the metal screw 355), instead of a screw made of resin that is not appropriate for repeated attachment and detachment, is employed together with the L-shaped flat nut 353, improving usability.

Figure 13:
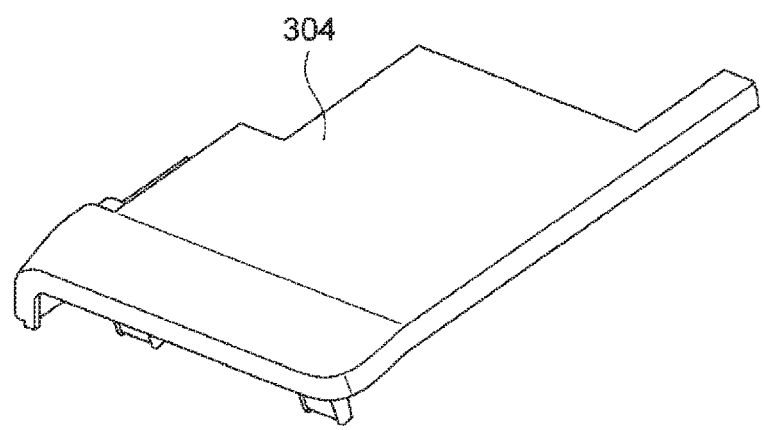
FIG. 13 is a perspective view of a front side of the third cover depicted in FIG. 4A.
Figure 14:
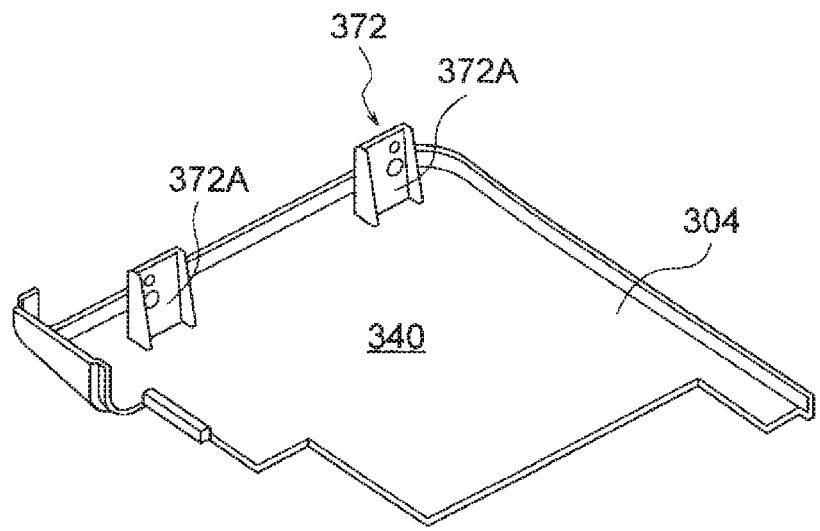
FIG. 14 is a perspective view of a back side of the third cover depicted in FIG. 13.
Figure 15:
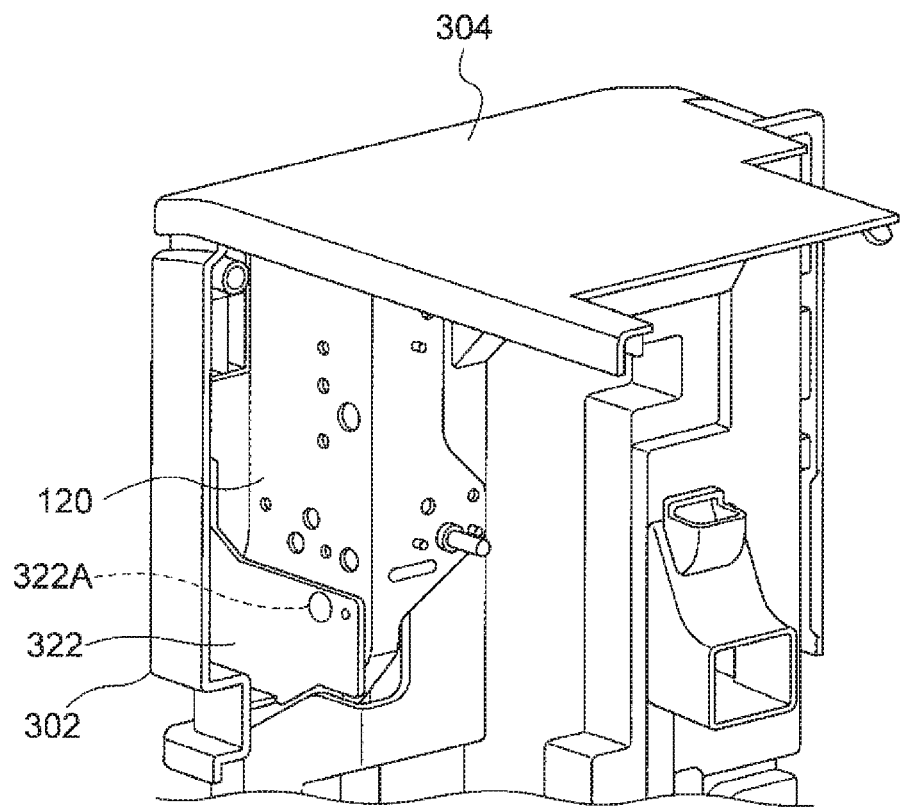
FIG. 15 is a perspective view of the first cover depicted in FIG. 6, illustrating a boss that engages a recess of the frame.

As illustrated in FIGS. 13 and 14, the third cover 304 includes a third cover body 340 that is platy and a fourth fastening portion 372. The fourth fastening portion 372 includes a pair of projecting pieces 372A that is disposed on a first cover body side end of the third cover body 340, which faces the first cover body 320 depicted in FIG. 3. The projecting pieces 372A are spaced apart from each other horizontally in the left-to-right direction. Each of the projecting pieces 372A is platy and projects from the third cover body 340.

The L-shaped cover 301 further includes a second fastener that secures the first cover 302 to the third cover 304. As illustrated in FIGS. 6 and 14, the second fastener includes a third fastening portion 371 incorporated in the first cover 302, the fourth fastening portion 372 incorporated in the third cover 304, and a metal screw.

As illustrated in FIG. 6, the third fastening portion 371 is disposed at two positions in an upper end of the first cover body 320 such that the two third fastening portions 371 are interposed between the left arm 321 and the right arm 322 and spaced apart from each other horizontally. Each of the third fastening portions 371 is tubular and projects from the first cover body 320.

The second fastener moves each of the projecting pieces 372A of the third cover 304 closer to a tip of the third fastening portion 371, that is tubular, of the first cover 302. The second fastener screws the metal screw into each of the third fastening portion 371 and the projecting pieces 372A of the fourth fastening portion 372. Thus, the first cover 302 is secured to the third cover 304.

A description is provided of processes for assembling the front upper right cover portion 300.

The second cover 303 is moved closer to the first cover 302. As illustrated in FIG. 5B, each of the second engagements 331 of the second cover 303 is inserted into the engaging hole 326 of the first cover 302. The second cover 303 is moved rearward relative to the first cover 302. As the slope 334B depicted in FIG. 10 of each of the arms 334 contacts the free end side end of the engaging hole 326 depicted in FIG. 8, the slope 334B presses the leftward projection 325B against the second cover body 330 depicted in FIG. 9. Thus, the second cover 303 engages the first cover 302. Accordingly, the second cover 303 is secured to the first cover 302.

The first plate 353A of the L-shaped flat nut 353 depicted in FIG. 11B is moved closer to the tip of the tube 356 of the first cover 302 depicted in FIG. 11A. The metal screw 354 is screwed into the first plate 353A and the tube 356. The second fastening portion 352 of the second cover 303 depicted in FIG. 12 is moved closer to the first fastening portion 351 depicted in FIG. 5A. The metal screw 355 depicted in FIG. 7B is screwed into the screw hole 360 of the second fastening portion 352 depicted in FIG. 4A, the insertion through hole 358 of the first fastening portion 351 depicted in FIG. 11B, and the screw hole 359 of the second plate 353B of the L-shaped flat nut 353 at the position where the screw hole 360, the insertion through hole 358, and the screw hole 359 communicate with the metal screw 355. Thus, the first cover 302 is secured to the second cover 303.

Each of the projecting pieces 372A of the third cover 304 depicted in FIG. 14 is moved closer to the tip of the third fastening portion 371, that is tubular, of the first cover 302 depicted in FIG. 6. The metal screw is screwed into the third fastening portion 371 and each of the projecting pieces 372A of the fourth fastening portion 372. Thus, the first cover 302 is secured to the third cover 304. Accordingly, the front upper right cover portion 300 is assembled.

As illustrated in FIGS. 4A, 4B, 5A, and 15, the first cover body 320 of the front upper right cover portion 300 is moved closer to the frame 120 such that the first cover body 320 is disposed opposite the opening 120B of the frame 120. As the left arm 321 and the right arm 322 contact the frame 120 and the first cover body 320 is moved closer to the frame 120, the left arm 321 and the right arm 322 are stretched out. As the first cover body 320 is moved even closer to the frame 120, the left arm 321 and the right arm 322 resume the natural state thereof, sandwiching the frame 120. As illustrated in FIG. 4B, in each of the first engagements 325, the rightward projection 325A engages the hole 120A of the frame 120. That is, each of the first engagements 325 engages the hole 120A of the frame 120. The boss 322A mounted on the right arm 322 depicted in FIG. 6 engages the recess of the frame 120. Accordingly, the first cover 302 engages the frame 120. Thus, the first cover 302 is attached to the frame 120. That is, the front upper right cover portion 300 is attached to the frame 120.

A description is provided of processes for removing the second cover 303 of the front upper right cover portion 300 to connect the optional device 30 to the image forming portion 10.

As illustrated in FIGS. 7A and 7B, the first fastener 305 that secures the first cover 302 to the second cover 303 is released. The second cover 303 is moved frontward relative to the first cover 302. Contact of the slope 334B of each of the arms 334 depicted in FIG. 10 with the free end side end of the engaging hole 326 depicted in FIG. 5B is canceled. Thereafter, the second cover 303 is moved leftward in a direction in which the second cover 303 separates from the first cover 302. Thus, the second cover 303 is removed. As illustrated in FIG. 7A, the recess 321C defined by the middle portion 321A of the left arm 321 exposes the connector socket 30A of the optional device 30 supported by the frame 120. Accordingly, the operator plugs the connector into the connector socket 30A without removing the first cover 302.

In order to remove the front upper right cover portion 300 from the frame 120, the rear end 330a of the second cover body 330 depicted in FIG. 9 is drawn leftward. The left arm 321 depicted in FIG. 6 deforms elastically. The first engagement 325 disposed on the free end 321D of the left arm 321 is also moved leftward together with the second cover body 330. The pair of first engagements 325 is pulled out of the holes 120A depicted in FIG. 4A, respectively. Thus, engagement of the pair of first engagements 325 with the holes 120A is released. With this state, the front upper right cover portion 300 is moved in a direction in which the front upper right cover portion 300 separates from the frame 120. Accordingly, engagement of the boss 322A depicted in FIG. 15 with the recess is also released. Thus, the front upper right cover portion 300 is removed from the frame 120.

As illustrated in FIGS. 2 and 4A, according to the embodiments described above, the housing 90 includes the frame 120 and the L-shaped cover 301. The frame 120 serves as a body portion that includes the opening 120B. The L-shaped cover 301 serves as a cover portion that covers the opening 120B. The L-shaped cover 301 includes the first cover 302 and the second cover 303 that is perpendicular to the first cover 302. As illustrated in FIG. 5A, the first cover 302 includes the first cover body 320 that is platy and the first engagement 325. The first engagement 325 serves as a first attachment that is mounted on the left arm 321 serving as a projection that projects from the first cover body 320. The first engagement 325 attaches the first cover 302 to the frame 120. The engaging hole 326 serves as a second attachment that is mounted on the first engagement 325 and attaches the second cover 303 to the first cover 302. For example, the first engagement 325, which defines an attachment position where the first cover 302 is attached to the frame 120, and the engaging hole 326, which defines an attachment position where the second cover 303 is attached to the first cover 302, are situated at a substantially identical position. Accordingly, even if tolerance occurs, an amount of displacement is minimized. Consequently, a plurality of covers, that is, the first cover 302 and the second cover 303, is positioned with improved precision.

As illustrated in FIG. 5A, the first cover 302 further includes the pair of arms, that is, the left arm 321 and the right arm 322, each of which serves as a resilient member. The left arm 321 serving as a first resilient member is disposed opposite the right arm 322 serving as a second resilient member. The left arm 321 and the right arm 322 sandwich the frame 120 serving as the body portion. The first engagement 325 serving as the first attachment is mounted on one of the pair of the left arm 321 and the right arm 322, that is, the left arm 321. Accordingly, while the pair of the left arm 321 and the right arm 322 sandwiches the frame 120, the first engagement 325 attaches the first cover 302 to the frame 120. Thus, the pair of the left arm 321 and the right arm 322 that sandwiches the frame 120 provides a safe condition for installation.

The first engagement 325 serving as the first attachment is mounted on the free end 321D of one of the pair of the left arm 321 and the right arm 322, that is, the left arm 321 serving as an arm or the first resilient member. The first engagement 325 engages the frame 120 serving as the body portion. Accordingly, in order to attach the first cover 302 to the frame 120, the first engagement 325 of the first cover 302 is moved closer to the frame 120 and the left arm 321 is deformed elastically so that the first engagement 325 engages the frame 120. Conversely, in order to remove the first cover 302 from the frame 120, the first engagement 325 of the first cover 302 is pulled in a separation direction in which the first cover 302 separates from the frame 120 and the left arm 321 is deformed elastically so that engagement of the first engagement 325 with the frame 120 is released. As described above, the first engagement 325 is disposed on the free end 321D of the left arm 321 serving as the arm or the first resilient member such that the first engagement 325 is engageable with the frame 120, facilitating attachment and detachment of the first cover 302 to and from the frame 120. Thus, the front upper right cover portion 300 is attached to and detached from the frame 120 readily.

As illustrated in FIG. 5B, the engaging hole 326 serving as the second attachment penetrates through the left arm 321 serving as the arm or the first resilient member. As illustrated in FIG. 9, the second cover 303 includes the second cover body 330 and the second engagement 331. The second cover body 330 is platy. The second engagement 331 is mounted on the second cover body 330 and engages the engaging hole 326 depicted in FIG. 8. For example, the second engagement 331 of the second cover 303 is moved closer to the left arm 321 of the first cover 302. As illustrated in FIG. 5B, as the second engagement 331 enters the engaging hole 326 and is moved, the second engagement 331 comes into contact with an edge of the engaging hole 326, causing the second cover 303 to engage the first cover 302. Thus, the second cover 303 is attached to the first cover 302.

Conversely, the second engagement 331 of the second cover 303 is moved closer to the left arm 321 of the first cover 302. As the second engagement 331 enters the engaging hole 326 and is moved inside the engaging hole 326, the second engagement 331 separates from the edge of the engaging hole 326, releasing contact of the second engagement 331 with the edge of the engaging hole 326. Thus, engagement of the second cover 303 with the first cover 302 is released. Accordingly, the second cover 303 is removed from the first cover 302.

As described above, the engaging hole 326 penetrates through the left arm 321. The second cover 303 includes the second cover body 330 and the second engagement 331. The second cover body 330 is platy. The second engagement 331 is mounted on the second cover body 330 and engages the engaging hole 326. Thus, the second cover 303 is attached to and detached from the first cover 302 readily.

As illustrated in FIG. 9, while the second engagement 331 engages the engaging hole 326 depicted in FIG. 8, the first engagement 325 serving as the first attachment is situated between a free end side end (e.g., the rear end 330a) of the second cover body 330, which is disposed opposite the free end 321D of the left arm 321 depicted in FIG. 6 serving as the arm or the first resilient member, and the intermediate portion 330b of the second cover body 330 in a projection direction in which the left arm 321 projects. Hence, as the rear end 330a of the second cover body 330, which is disposed opposite the free end 321D of the left arm 321, is pulled in a separation direction in which the rear end 330a of the second cover body 330 separates from the left arm 321, the rear end 330a of the second cover body 330 is displaced. Accordingly, the left arm 321 is displaced in a release direction in which engagement of the first engagement 325 with the frame 120 serving as the body portion is released. The closer the first engagement 325 is situated to the rear end 330a of the second cover body 330, the farther the first engagement 325 is displaced. Accordingly, while the second engagement 331 engages the engaging hole 326, the first engagement 325 is interposed between the free end side end (e.g., the rear end 330a) of the second cover body 330, which is disposed opposite the free end 321D of the left arm 321, and the intermediate portion 330b of the second cover body 330 in the projection direction in which the left arm 321 projects. Consequently, the first cover 302 is removed from the frame 120 readily.

The plurality of first engagements 325 serving as the first attachment causes the frame 120 serving as the body portion to support the first cover body 320 at a plurality of proper positions on the frame 120, stabilizing the posture of the first cover 302 that is attached to the frame 120. If the first cover 302 is a large part, the plurality of first engagements 325 positions the first cover 302 on desired positions on the frame 120. Accordingly, the first cover 302 and an adjacent cover, for example, properly define a gap, a step, or the like therebetween, improving the external appearance thereof.

As illustrated in FIG. 6, the left arm 321 serving as the arm or the first resilient member is a plate extending in an extending direction perpendicular to the projection direction in which the left arm 321 projects. The plurality of first engagements 325 serving as the first attachment is spaced from each other vertically in the extending direction of the left arm 321. A length in the projection direction of the middle portion 321A of the left arm 321, which is interposed between the plurality of first engagements 325, is smaller than a length from the base 321E to the first engagement 325 serving as the first attachment in the projection direction such that the middle portion 321A defines the recess 321C. Accordingly, as illustrated in FIG. 7A, the recess 321C (e.g., the cutout) defined by the middle portion 321A of the left arm 321 exposes the connector socket 30A of the optional device 30 supported by the frame 120 serving as the body portion. When engagement of the second cover 303 with the first cover 302 is released and the second cover 303 is removed from the first cover 302, the connector socket 30A of the optional device 30 supported by the frame 120 is exposed through the recess 321C. Accordingly, while the first cover 302 is attached to the frame 120 serving as the body portion, the operator connects the optional device 30 electrically. As described above, the operator connects the optional device 30 electrically with a single operation of removing the second cover 303 without removing the first cover 302 and the second cover 303 from the frame 120.

As illustrated in FIG. 7B, the housing 90 further includes the first fastener 305 serving as a fastener that secures the second cover 303 to the first cover 302. Thus, the second cover 303 is secured to the first cover 302 precisely.

As illustrated in FIG. 1, the image forming apparatus 1 includes the internal sheet ejection device 91 serving as an internal sheet ejection portion. The internal sheet ejection device 91 includes the image reader 4, the sheet ejection device 5, and the image forming portion 10. The image reader 4 serves as a scanner that reads an image on an original into image data. The sheet ejection device 5 receives a sheet P serving as a recording medium bearing an output image (e.g., a toner image). The image forming portion 10 includes an image forming device (e.g., the process cartridges 10Y, 10M, 10C, and 10BK) that forms the output image. The housing 90 is interposed between the image reader 4 and the image forming portion 10 in the vertical direction. One end of the first cover 302 is disposed at one end of the image forming portion 10 in the left-to-right direction and the second cover 303 is disposed at another end of the first cover 302 in the left-to-right direction, that is, the horizontal direction perpendicular to the vertical direction. Since the housing 90 is interposed between the image reader 4 and the image forming portion 10 vertically, the operator may not access the second cover 303 readily. To address this circumstance, the second engagement 331 of the second cover 303 depicted in FIG. 9 engages the engaging hole 326 of the first cover 302 depicted in FIG. 8 to attach the second cover 303 to the first cover 302. Accordingly, as engagement of the second engagement 331 with the engaging hole 326 is released, the operator removes the second cover 303 from the first cover 302 readily.

As illustrated in FIG. 2, the image forming apparatus 1 further includes the support 12 that supports the image forming portion 10 and the housing 90. The support 12 mounts the front cover 13 that covers the front of the image forming portion 10. The first cover 302 is separated from the front cover 13. Since the first cover 302 is provided separately from the front cover 13, when one of the first cover 302 and the front cover 13 is opened or closed, for example, another one of the first cover 302 and the front cover 13 is not opened or closed. Accordingly, the operator merely opens or closes the first cover 302 or the front cover 13 to perform a desired operation.

Technology of the present disclosure is not limited to the embodiments described above and involves other configurations and the like, including modification examples described below, which achieve objectives of the present disclosure.

According to the embodiments described above, the first engagement 325 serving as the first attachment secures the first cover body 320 to the frame 120 serving as the body portion. However, the technology of the present disclosure is not limited to this configuration. The first attachment is not limited to the first engagement 325. Alternatively, the first cover body 320 may be secured to the frame 120 serving as the body portion by other methods, instead of engagement with the first engagement 325.

Similarly, the second engagement 331 serving as the engagement engages the engaging hole 326 to attach the second cover 303 to the first cover 302. However, the technology of the present disclosure is not limited to this configuration. Alternatively, the engagement may be mounted on the second cover 303 by other methods. For example, the first attachment, which defines an attachment position where the first cover body 320 is attached to the frame 120 serving as the body portion, and the second attachment, which defines an attachment position where the second cover 303 is attached to the first cover body 320, may be situated at a substantially identical position. This configuration achieves advantages that are equivalent to the advantages of the embodiments described above.

According to the embodiments described above, the left arm 321 serving as the arm mounts the pair of first engagements 325. However, the technology of the present disclosure is not limited to this configuration. For example, the arm may mount three or more engagements.

The image forming apparatus 1 according to the embodiments described above forms an image by electrophotography. However, the technology of the present disclosure is not limited to this configuration. For example, the housing 90 may be applied to an image forming apparatus that forms an image by an inkjet method.

A description is provided of advantages of the housing 90.

As illustrated in FIGS. 2 and 4A, the housing 90 includes a body portion (e.g., the frame 120) and a cover portion (e.g., the L-shaped cover 301). As illustrated in FIG. 4A, the body portion includes an opening (e.g., the opening 120B). The cover portion covers the opening. The cover portion includes a first cover (e.g., the first cover 302) and a second cover (e.g., the second cover 303) perpendicular to the first cover. As illustrated in FIG. 5A, the first cover includes a first cover body (e.g., the first cover body 320), a projection (e.g., the left arm 321), a first attachment (e.g., the first engagement 325), and a second attachment (e.g., the engaging hole 326). The first cover body is platy. The projection projects from the first cover body. The first attachment is mounted on the projection and attaches the first cover to the body portion. The second attachment is disposed on the first attachment and attaches the second cover to the first cover.

For example, the first attachment, which defines an attachment position where the first cover is attached to the body portion, and the second attachment, which defines an attachment position where the second cover is attached to the first cover, are situated at a substantially identical position. Accordingly, even if tolerance occurs, an amount of displacement is minimized. Consequently, a plurality of covers, that is, the first cover and the second cover, is positioned with improved precision.

The above-described embodiments are illustrative and do not limit the present disclosure. Thus, numerous additional modifications and variations are possible in light of the above teachings. For example, elements and features of different illustrative embodiments may be combined with each other and substituted for each other within the scope of the present disclosure.

Any one of the above-described operations may be performed in various other ways, for example, in an order different from the one described above.

What is claimed is:

1. A housing comprising:
a main body including an opening; and
a cover portion to cover the opening,
the cover portion including:
a first cover; and
a second cover, perpendicular to the first cover,
the first cover including:
a cover body that is plate-like; and
a projection, projecting from the cover body, including a first attachment mounted on the projection, to attach the first cover to the main body, and including an engaging hole, disposed in the projection, to receive a second attachment and to attach the second cover to the first cover upon receipt of the second attachment.

2. The housing according to claim 1,
wherein the projection includes a resilient member mounting the first attachment.

3. The housing according to claim 2,
wherein the first cover further includes another projection including another resilient member disposed opposite the resilient member, and
wherein the main body is sandwiched between the resilient member and the another resilient member.

4. The housing according to claim 3,
wherein the first attachment is mounted on the resilient member.

5. The housing according to claim 4,
wherein the resilient member includes an arm.

6. The housing according to claim 5,
wherein the arm includes a free end mounting the first attachment, to engage the main body.

7. The housing according to claim 6,
wherein the second attachment includes an engaging hole penetrating through the arm.

8. The housing according to claim 7,
wherein the second cover includes:
another cover body that is plate-like; and
an engagement, mounted on said another cover body, to engage the engaging hole.

9. The housing according to claim 8,
wherein said another cover body includes:
a free end side end disposed opposite the free end of the arm; and
an intermediate portion in a projection direction in which the arm projects, and
wherein, while the engagement engages the engaging hole, the first attachment is situated between the free end side end and the intermediate portion of said another cover body.

10. The housing according to claim 9, further comprising another first attachment, mounted on the arm, to attach the first cover to the main body,
wherein the arm is plate-like and extends in an extending direction perpendicular to the projection direction in which the arm projects, and
wherein the first attachment is spaced from said another first attachment in the extending direction of the arm.

11. The housing according to claim 10,
wherein the arm further includes:
a base; and
a middle portion interposed between the first attachment and said another first attachment in the extending direction of the arm, and
wherein a length of the middle portion in the projection direction is smaller than a length from the base to the first attachment in the projection direction such that the middle portion defines a recess.

12. The housing according to claim 1, further comprising another first attachment, mounted on the projection, to attach the first cover to the main body.

13. The housing according to claim 1, further comprising a fastener to secure the second cover to the first cover.

14. An image forming apparatus comprising:
a finisher to perform finishing on a recording medium bearing an image; and
a housing to cover the finisher,
the housing including:
a main body including an opening; and
a cover portion to cover the opening,
the cover portion including:
a first cover; and
a second cover perpendicular to the first cover,
the first cover including:
a cover body that is plate-like, and
a projection, projecting from the cover body, including a first attachment mounted on the projection, to attach the first cover to the main body, and including an engaging hole, disposed in the projection, to receive a second attachment and to attach the second cover to the first cover upon receipt of the second attachment.

15. The image forming apparatus of claim 14, wherein the projection of the housing includes a resilient member mounting the first attachment.

16. The image forming apparatus of claim 15, wherein the first cover of the cover portion of the housing further includes another projection including another resilient member disposed opposite the resilient member, and wherein the main body is sandwiched between the resilient member and the another resilient member.

17. An image forming apparatus comprising:
an internal sheet ejection portion including:
- an image reader to read an image on an original;
- an image forming portion to form the image on a recording medium; and
- a sheet ejection device to receive the recording medium bearing the image; and a housing interposed between the image reader and the image forming portion in a vertical direction, the housing including:
- a main body including an opening; and
- a cover portion to cover the opening, the cover portion including:
- a first cover; and
- a second cover that is perpendicular to the first cover, the first cover including:
- a cover body that is plate-like; and
- a projection, projecting from the cover body, including a first attachment mounted on the projection, to attach the first cover to the main body, and including an engaging hole, disposed in the projection, to receive a second attachment and to attach the second cover to the first cover upon receipt of the second attachment, one end of the first cover being disposed at one end of the image forming portion in a horizontal direction, and the second cover being disposed at another end of the first cover in the horizontal direction.

18. The image forming apparatus according to claim 17, further comprising a finisher to perform finishing on the recording medium bearing the image, wherein the housing covers the finisher.

19. The image forming apparatus according to claim 18, further comprising:
- a support supporting the image forming portion and the housing; and
- a front cover, mounted on the support, to cover a front of the image forming portion, the front cover being separated from the first cover of the housing.

20. The image forming apparatus of claim 17, wherein
the projection of the housing includes a resilient member mounting the first attachment,
the first cover of the cover portion of the housing further includes another projection including another resilient member disposed opposite the resilient member, and
the main body is sandwiched between the resilient member and the another resilient member.

\* \* \* \* \*